(12) United States Patent
Lu

(10) Patent No.: US 11,862,699 B2
(45) Date of Patent: Jan. 2, 2024

(54) SEMICONDUCTOR STRUCTURE AND METHOD FOR MANUFACTURING SAME

(71) Applicant: CHANGXIN MEMORY TECHNOLOGIES, INC., Anhui (CN)

(72) Inventor: Jingwen Lu, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 120 days.

(21) Appl. No.: 17/449,483

(22) Filed: Sep. 30, 2021

(65) Prior Publication Data

US 2022/0045186 A1 Feb. 10, 2022

Related U.S. Application Data

(63) Continuation of application No. PCT/CN2021/103701, filed on Jun. 30, 2021.

(30) Foreign Application Priority Data

Aug. 5, 2020 (CN) .......................... 202010776948.1

(51) Int. Cl.
| | |
|---|---|
| *H01L 29/423* | (2006.01) |
| *H01L 29/51* | (2006.01) |
| *H01L 29/417* | (2006.01) |
| *H10B 12/00* | (2023.01) |

(52) U.S. Cl.
CPC .. *H01L 29/42372* (2013.01); *H01L 29/41775* (2013.01); *H01L 29/512* (2013.01); *H10B 12/315* (2023.02)

(58) Field of Classification Search
CPC . H01L 21/31155; H10B 12/482; H10B 12/48; H10B 12/485
See application file for complete search history.

(56) References Cited

U.S. PATENT DOCUMENTS

| | | | |
|---|---|---|---|
| 6,764,893 B2 | 7/2004 | Sung-Kwon | |
| 10,910,380 B2 | 2/2021 | Takesako et al. | |
| 2004/0014278 A1 | 1/2004 | Sung-Kwon | |
| 2008/0093741 A1* | 4/2008 | Lee | H10B 12/485 |
| | | | 257/E23.141 |
| 2019/0019795 A1 | 1/2019 | Takesako et al. | |

(Continued)

FOREIGN PATENT DOCUMENTS

| | | |
|---|---|---|
| CN | 1234609 A | 11/1999 |
| CN | 1469428 A | 1/2004 |
| CN | 1612301 A | 5/2005 |

(Continued)

*Primary Examiner* — Raj R Gupta
(74) *Attorney, Agent, or Firm* — Syncoda LLC; Feng Ma

(57) ABSTRACT

A semiconductor structure includes: a substrate with conductive contact regions; a bit line structure and an isolation wall located on a sidewall of the bit line structure, the isolation wall includes at least one isolation layer including a first isolation part close to the bit line structure and a second isolation part deviating from the same, the second isolation part has doped ions, such that it has a greater hardness than the first isolation part, or has a smaller dielectric constant than the first isolation part; and a capacitor contact hole, which exposes the conductive contact region, and has a top width greater than a bottom width in a direction parallel to an orientation of the bit line structure.

12 Claims, 13 Drawing Sheets

(56) References Cited

U.S. PATENT DOCUMENTS

2020/0119020 A1   4/2020  Takesako et al.
2021/0175075 A1*  6/2021  Sharma ............. H01L 21/02337

FOREIGN PATENT DOCUMENTS

| CN | 101635278 B | 11/2011 |
| CN | 103681263 A | 3/2014 |
| CN | 109256382 A | 1/2019 |
| CN | 208738213 U | 4/2019 |
| CN | 110718532 A | 1/2020 |

* cited by examiner

SEMICONDUCTOR STRUCTURE AND METHOD FOR MANUFACTURING SAME

CROSS-REFERENCE TO RELATED APPLICATIONS

This is a continuation of International Application PCT/CN2021/103701 filed on Jun. 30, 2021, which claims priority to Chinese Patent Application No. 202010776948.1 filed on Aug. 5, 2020. The disclosures of these applications are hereby incorporated by reference in their entirety.

BACKGROUND

A wire connection between a transistor and a capacitor of a dynamic random-access memory (DRAM) is typically performed by deposition of polysilicon or a metal. As the semiconductor manufacturing procedure is miniaturized, the size of a capacitor contact hole connecting the transistor and the capacitor of the DRAM is also miniaturized. When the aspect ratio of the capacitor contact hole is higher, a void is liable to occur when filling the capacitor contact hole, which greatly increases the wire resistance.

SUMMARY

The present disclosure relates to a semiconductor structure and a method for manufacturing the same.

According to some embodiments, the first aspect of the present disclosure provides a semiconductor structure, which includes: a substrate, in which conductive contact regions is provided, and the substrate exposes the conductive contact regions; a bit line structure and an isolation wall located on a sidewall of the bit line structure, in which multiple discrete bit line structures are located on the substrate, and in which the isolation wall includes at least one isolation layer, which includes a first isolation part close to the bit line structure and a second isolation part deviating from the bit line structure, doped ions are provided in the second isolation part of the at least one of the isolation layer, and a hardness of the second isolation part is greater than that of the first isolation part, or a dielectric constant of the second isolation part is less than that of the first isolation part; and a capacitor contact hole, which is constituted by a region defined by the isolation wall between adjacent bit line structures, and exposes the conductive contact regions, in which a top width of the capacitor contact hole is greater than a bottom width of the capacitor contact hole in a direction parallel to an orientation of the bit line structure.

According to some other embodiments, the second aspect of the present disclosure provides a method for manufacturing a semiconductor structure is further provided. The method includes the following operations. A substrate is provided, in which conductive contact regions are provided in the substrate, and the substrate exposes the conductive contact regions; multiple discrete bit line structures are formed on the substrate, in which the bit line structures are configured to expose the conductive contact regions, and a top width is smaller than a bottom width of the bit line structures in a direction parallel to an orientation of the bit line structures; and isolation walls including at least one isolation layer are formed on sidewalls of the bit line structures, in which capacitor contact holes are constituted by regions defined by the isolation walls between adjacent bit line structures, the isolation layer includes a first isolation part close to the bit line structures and a second isolation part deviating from the bit line structures, in which in an operation that the isolation walls are formed, doped ions are doped into the second isolation part of the at least one of the isolation layer, such that a hardness of the second isolation part is greater than that of the first isolation part, or a dielectric constant of the second isolation part is less than that of the first isolation part.

BRIEF DESCRIPTION OF THE DRAWINGS

One or more embodiments are exemplarily described by the figures in the corresponding accompanying drawings which do not constitute a limitation on the embodiments. The figures in the drawings do not constitute a scale limitation unless otherwise stated.

DETAILED DESCRIPTION

Figure 1:
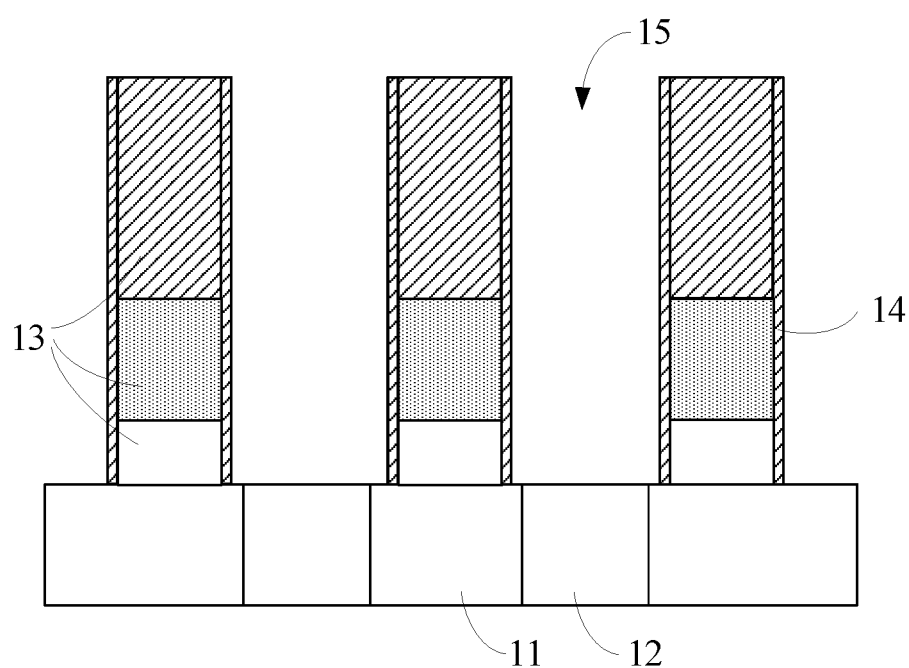
FIG. 1 is a first schematic diagram of sectional structures corresponding to various operations of a method for manufacturing a semiconductor structure.

Referring to FIG. 1, a substrate 11, multiple discrete bit line structures 13 located on the substrate 11, isolation walls 14 and capacitor contact holes 15 are provided. Conductive contact regions are provided in the substrate 11. The bit line structures 13 are arranged to expose the conductive contact regions 12. The isolation walls are located on sidewalls of the bit line structures 13. The capacitor contact holes 15 are constituted by regions defined by the isolation walls 14 between adjacent bit line structures, which expose the conductive contact regions 12, and are configured to be filled with a conductive material to form conductive plugs.

Figure 2:
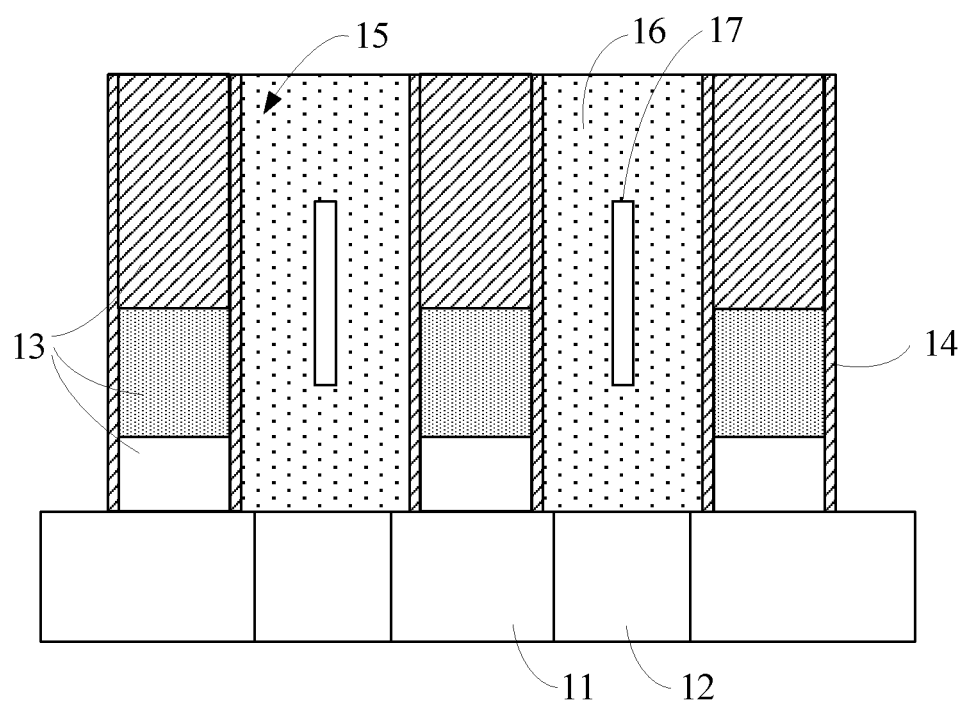
FIG. 2 is a second schematic diagram of sectional structures corresponding to various operations of a method for manufacturing a semiconductor structure.

Referring to FIG. 2, the capacitor contact holes 15 are filled with the conductive material to form conductive plugs 16.

Since the thicknesses of the isolation walls 14 in a direction perpendicular to the sidewalls of the bit line structures 13 are generally the same, the contour morphologies of the capacitor contact holes 15 depend on those the sidewalls of the bit line structures 13. In a direction parallel to the orientation of the bit line structures 13, the top width of the bit line structures 13 is equal to their bottom width, and the top width of the capacitor contact holes 15 is equal to their bottom width.

When the aspect ratio of the capacitor contact holes 15 is larger, top openings of the capacitor contact holes 15 may be sealed in advance during filling the conductive material, thereby forming conductive plugs 16 with voids 17. The existence of the voids 17 would increases the resistance values of the conductive plugs 16.

Figure 3:
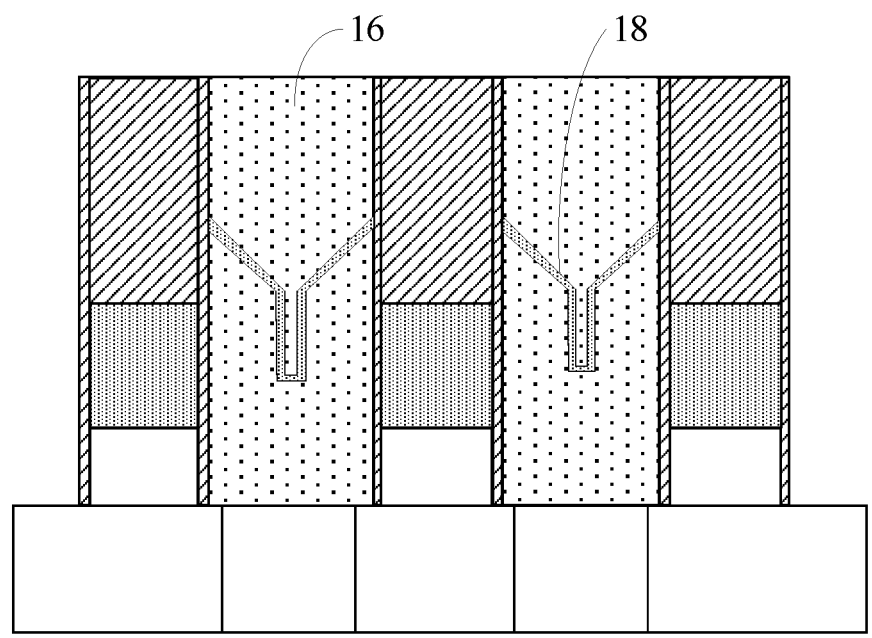
FIG. 3 is a third schematic diagram of sectional structures corresponding to various operations of a method for manufacturing a semiconductor structure.

Referring to FIG. 3, the conductive plugs 16 are etched back to expose the voids 17 (refer to FIG. 2); and the conductive material is filled again to eliminate the voids 17 and form conductive plugs 16.

During etching the conductive plugs 16 to expose the voids 17, the conductive material may be oxidized due to being exposed to an oxygen environment and finally forms non-conductive oxide layers 18. The existence of the oxide layer 18 also increases the resistance of the conductive plugs 16, thereby influencing the conductive performance of the conductive plugs 16.

In order to solve the aforementioned problems, an embodiment of the present disclosure provides a semiconductor structure and a manufacturing method thereof. By doping ions to a second isolation part of an isolation layer, a first isolation part and the second isolation part of the isolation layer have different material properties, thereby replacing successively stacked layers of two film layers with different material properties. Accordingly, the effects of reducing the number of the isolation layers and reducing the total thickness of the isolation walls are achieved. The thinning of the isolation walls helps to increase the bottom areas of the capacitor contact holes, which further reduces the resistance values of the conductive plugs and reduces the parasitic capacitance between a conductive plug and the conductive structure adjacent thereto. In addition, by increasing the top width of the capacitor contact holes and enlarging the process windows of the capacitor contact holes, the top openings of capacitor contact holes may be prevented from being sealed in advance in the material deposition process. The conductive material is ensured to fill up the capacitor contact holes, and further the conductive plugs without the voids or the oxide layer and having smaller resistance values are formed.

To make the objects, technical solutions and advantages of the embodiments of the present disclosure clearer, the embodiments of the present disclosure will be described in detail below in combination with the accompanying drawings. Those of ordinary skilled in the art can understand that, in various embodiments of the present disclosure, many technical details are presented to make readers understand the present disclosure better, whereas, the technical solutions claimed by the present disclosure can also be implemented even without these technical details and various changes and modifications made based on the following embodiments.

FIG. 4 to FIG. 13 are schematic diagrams of the sectional structures corresponding to various operations of a method for manufacturing a semiconductor structure provided by an embodiment of the present disclosure.

Figure 4:
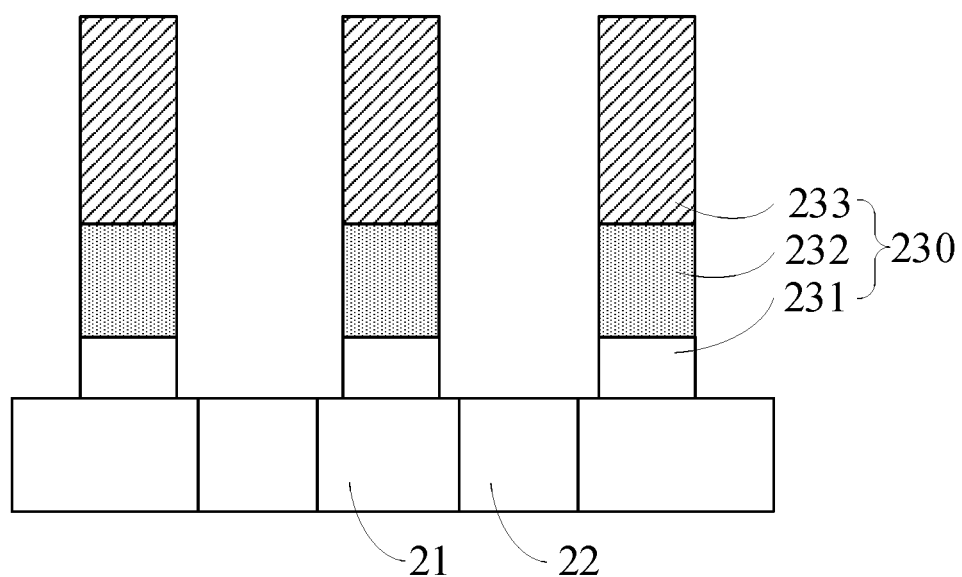
FIG. 4 is a first schematic diagram of sectional structures corresponding to various operations of a method for manufacturing a semiconductor structure provided by an embodiment of the present disclosure.

Referring to FIG. 4, a substrate 21 is provided. Conductive contact regions 22 are provided in the substrate 21. The substrate 21 exposes the conductive contact region 22. Multiple discrete initial bit line structures 230 are formed on the substrate 21, in which the top width is equal to the bottom width of the initial bit line structures 230 in a direction parallel to the orientation of the initial bit line structures 230.

An initial bit line structure 230 includes a conductive contact layer 231, a metal gate layer 232, and a top dielectric layer 233, which are arranged in sequence in a direction perpendicular to the substrate 21. The material of the conductive contact layer 231 includes polysilicon, the metal gate layer 232 includes a stacked structure of titanium nitride-tungsten-titanium nitride, and the material of the top dielectric layer 233 includes silicon nitride.

In other embodiments, the top width of the initial bit line structures may also be greater than or less than the bottom width.

Figure 5:
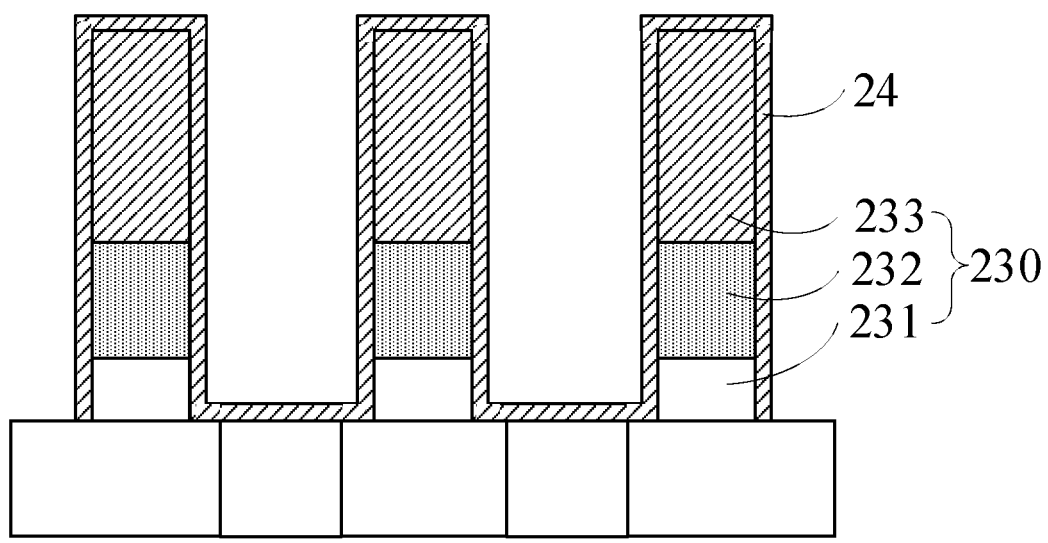
FIG. 5 is a second schematic diagram of sectional structures corresponding to various operations of a method for manufacturing a semiconductor structure provided by an embodiment of the present disclosure.

Referring to FIG. 5, a deposition process is performed to form a first isolation layer 24 on a sidewall of the initial bit line structure 230.

The first isolation layer 24 is configured to protect the metal gate layer 232 in the initial bit line structure 230, preventing the metal gate layer 232 from being damaged in subsequent etching, cleaning and other processes, thereby ensuring that the metal gate layer 232 has a good conductive performance and a good signal transmission performance.

In the embodiment, the first isolation layer 24 is separately formed by a deposition process. Since the first isolation layer 24 plays a role of protection and sidewall supporting, it may be formed by atomic layer deposition process, by which the first isolation layer 24 has higher compactness and better step coverage.

In the embodiment, the material of the first isolation layer 24 is the same as that of the top dielectric layer 233. As such, in the subsequent etching process, a specific etchant may be selected for the material of the first isolation layer 24, so that the etching process has a faster etching rate, which helps to reduce the manufacturing period of a semiconductor structure.

Figure 6:
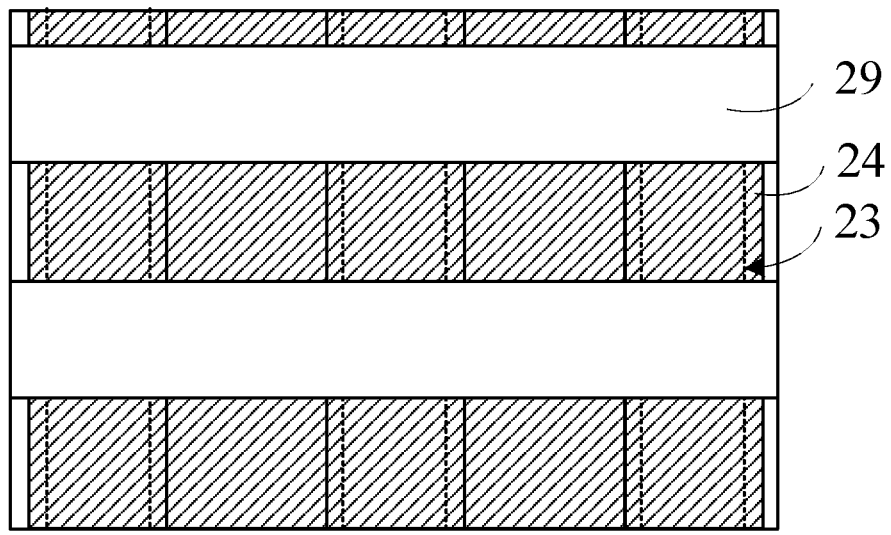
FIG. 6 is a third schematic diagram of sectional structures corresponding to various operations of a method for manufacturing a semiconductor structure provided by an embodiment of the present disclosure.

Referring to FIG. 6, spacer layers 29 are formed, the spacer layers 29 divide trenches between the adjacent initial bit line structures 230 into multiple discrete grooves, and each of the grooves is configured to form a conductive plug.

A parasitic capacitance may exist between conductive plugs in adjacent grooves, and the parasitic capacitance may also exist between the conductive plug in a certain groove and the metal gate layer in the initial bit line structure adjacent to the groove. The value of the parasitic capacitance is related to the resistance value of the conductive plug. The smaller the resistance of the conductive plug, the smaller the parasitic capacitance. In addition, the value of the parasitic capacitance is also related to the dielectric constant of an intermediate isolation material. The smaller the dielectric constant, the smaller the parasitic capacitance.

The resistance value of a conductive plug is related to the bottom area of the conductive plug, that is, the larger the bottom area, the smaller the resistance value. The resistance value of the conductive plug is also related to the structure and the material of the conductive plug. When there are fewer or smaller voids in the conductive plug and less dielectric material is contained in the conductive plug, the conductive plug has smaller resistance value.

It should be noted that, adjusting the top structure of the initial bit line structure 230 and forming the isolation wall on the sidewalls of the initial bit line structure 230 are primarily taken as exemplary illustration in the drawings herein. Indeed, in the embodiments of the present disclosure, the top structure of a spacer layer 29 is also adjusted accordingly and an isolation wall is formed on a sidewall of the spacer layer 29.

Figure 7:
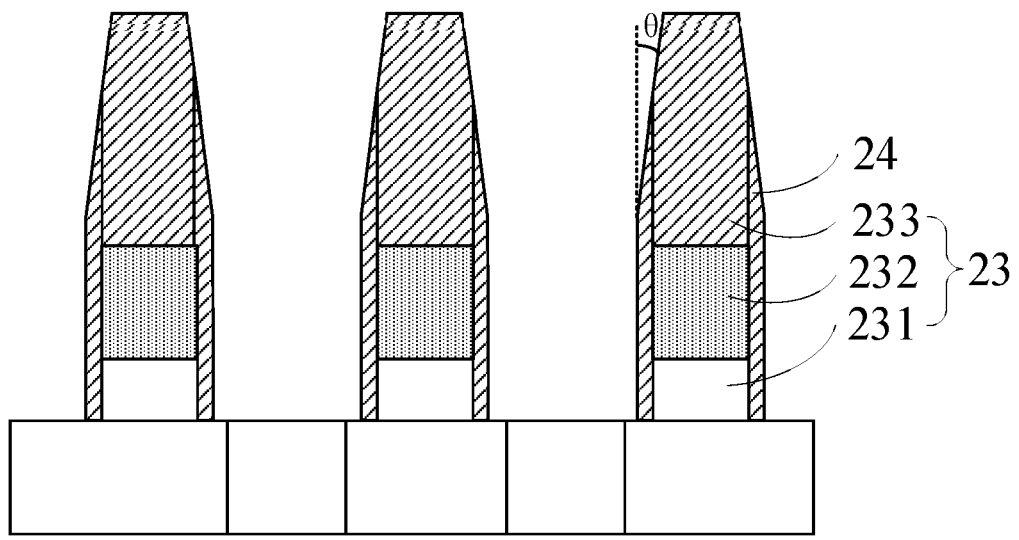
FIG. 7 is a fourth schematic diagram of sectional structures corresponding to various operations of a method for manufacturing a semiconductor structure provided by an embodiment of the present disclosure.

Referring to FIG. 7, an etching process is performed to the initial bit line structures 230 and the first isolation layer 24.

In the embodiment, after forming the first isolation layer 24, a dry etching process with an etching angle is performed to the first isolation layer 24 and the initial bit line structure 230 to form a bit line structure 23 with a chamfer θ at the top. The angle of the chamfer θ is the same as the etching angle. The angle of the chamfer θ is 5°-35°, for example 10°, 15°, 20° or 30°. In an actual process procedure, the optimal angle of the chamfer θ is 15°. The formation of the chamfer θ within the numerical range helps to enlarge the process window for subsequently forming capacitor contact holes, and prevent the capacitor contact holes from being sealed in advance when the conductive material is deposited. In addition, the setting of an upper limit value of the chamfer θ helps to reduce the process difficulty and prevent the metal gate layer 232 from being damaged by the dry etching process, thereby ensuring the conductive performances of the bit line structures 23.

In the embodiment, the etching process removes some of the material at the top corners of the top dielectric layer 233. The top dielectric layer 233 with a changed structure, the metal gate layer 232 and the conductive contact layer 231 together constitute the new bit line structure 23.

In addition, the etching process also removes the first isolation layer 24 on the bottom of the groove between the adjacent bit line structures 23 and the first isolation layer 24 on the top of the bit line structures 23.

In the embodiment, the dry etching process is performed by adopting a mixed plasma of three gases $SF_6$, $CF_4$ and $O_2$, and the residual gases are cleaned by using an inert gas (for example argon).

Figure 8:
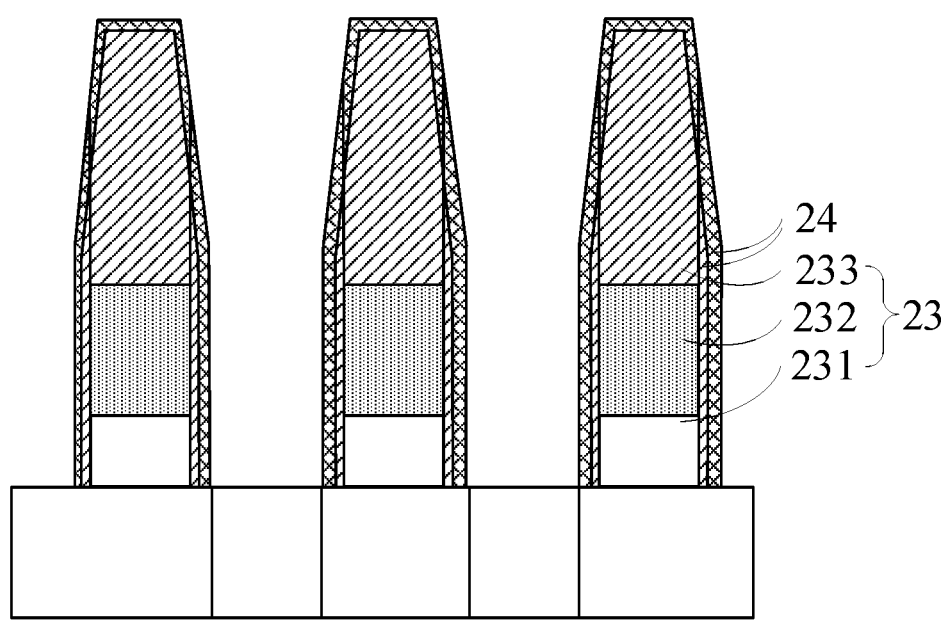
FIG. 8 is a fifth schematic diagram of sectional structures corresponding to various operations of a method for manufacturing a semiconductor structure provided by an embodiment of the present disclosure.

Referring to FIG. 8, a first ion doping process is performed to the first isolation layer 24.

In the embodiment, the first isolation layer 24 includes a first isolation part close to the bit line structures 23 and a second isolation part deviating from the bit line structures 23. An ion doping process is performed to the second isolation part, so that the dielectric constant of the second isolation part of the first isolation layer 24 is smaller than the dielectric constant of the first isolation part. In this way, the hardness of the first isolation part may be maintained such that the first isolation part may have a better sidewall supporting effect, and the isolation wall may have a lower dielectric constant without adding an additional film layer. In addition, the ion doping is only performed to the second isolation part, so that damage to the metal gate layer 232 caused by the ion doping process is avoided, and a good conductive performance of the metal gate layer 232 is ensured.

In the embodiment, the first ion doping process not only performs the ion doping to the second isolation part of the first isolation layer 24, but also to the top dielectric layer 233 exposed by the first isolation layer 24. In this way, when performing the first ion doping process, only the energy of the doped ion needs to be controlled to control the doping depth, and the doping position does not need to be limited, so that the doping difficulty is reduced, and the second isolation part of the first isolation layer 24 may be effectively doped.

In the embodiment, the material of the first isolation layer 24 includes silicon nitride, the first ion doping process performs an oxygen ion doping to the second isolation part of the first isolation layer 24, the material of the doped second isolation part includes silicon oxynitride, and the silicon oxynitride layer has a lower dielectric constant relative to the silicon nitride layer.

In the embodiment, taking oxygen as an oxygen source, the silicon nitride is doped with the oxygen plasma. The radio frequency power for forming the oxygen plasma is 600 to 2000 W, for example be 800 W, 1200 W or 1600 W. The temperature of the oxygen plasma is 800° C. to 1000° C., for example be 850° C., 900° C. or 950° C.

Figure 9:
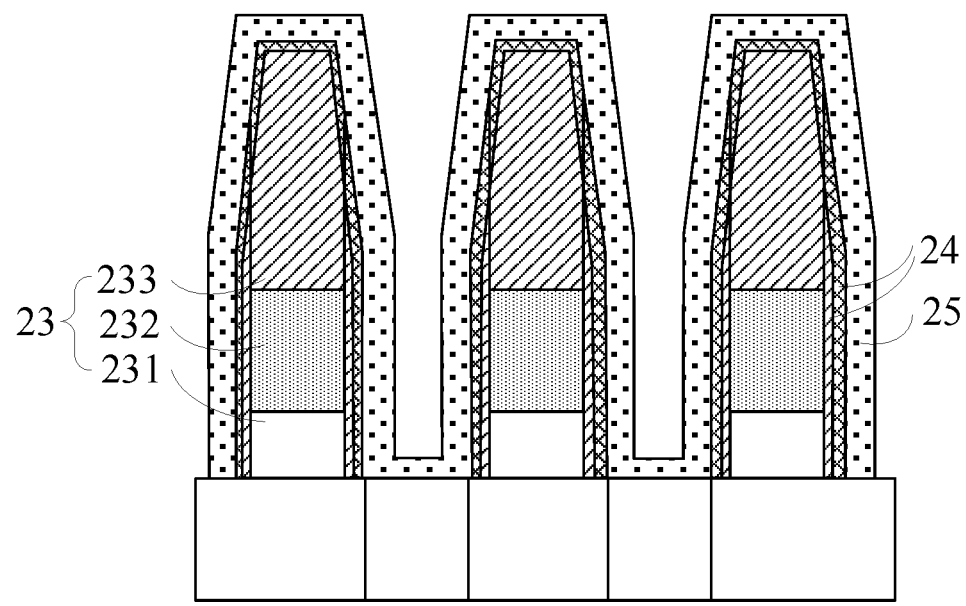
FIG. 9 is a sixth schematic diagram of sectional structures corresponding to various operations of a method for manufacturing a semiconductor structure provided by an embodiment of the present disclosure.

Referring to FIG. 9, A second isolation layer 25 is formed on the side of the first isolation layer 24 deviating from the bit line structures 23.

Specifically, the second isolation layer 25 is mainly configured to reduce the dielectric constant of the isolation wall, and the dielectric constant of the material of the second isolation layer 25 is smaller than that of the material of the first isolation layer 24.

In the embodiment, the material of the second isolation layer 25 includes silicon oxide. The second barrier layer 25 may be formed through an atomic layer deposition process. Specifically, LTO250 and oxygen or N zero and oxygen may be used to react to generate silicon oxide.

Figure 10:
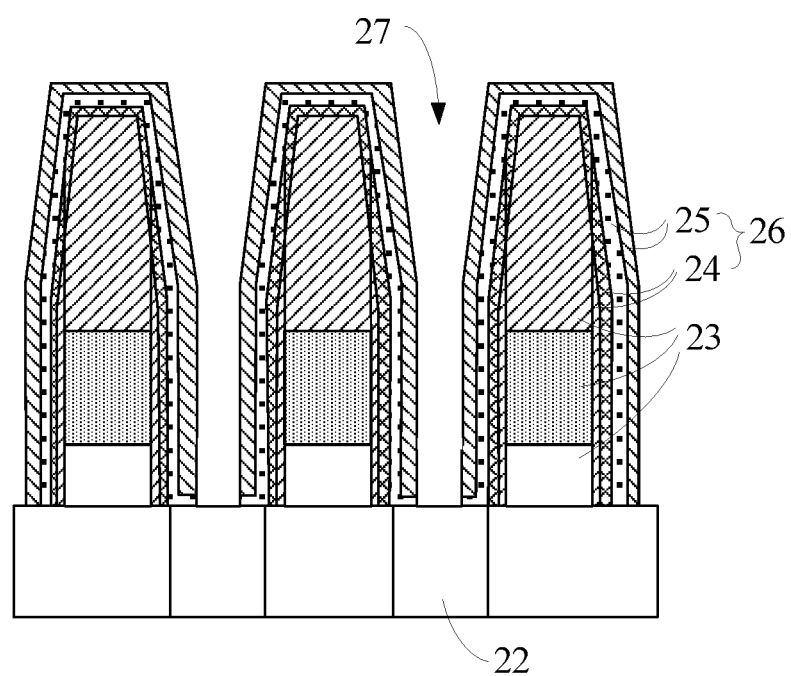
FIG. 10 is a seventh schematic diagram of sectional structures corresponding to various operations of a method for manufacturing a semiconductor structure provided by an embodiment of the present disclosure.

Referring to FIG. 10, a second ion doping process is performed to a second isolation part of the second isolation layer 25.

In the embodiment, the ion doping is performed to the second isolation part of the second isolation layer 25, such that the hardness of the second isolation part in the second isolation layer 25 is greater than the hardness of the first isolation part. In this way, the isolation wall can have higher sidewall supporting capacity without adding an additional film layer, and damages to the structures of isolation wall caused by stresses from adjacent structures may be avoided.

Specifically, the material of the second isolation layer 25 includes silicon oxide. A nitrogen ion doping process is performed to the second isolation part of the second isolation layer 25 during the second ion doping process, and the material of the doped second isolation part includes silicon nitride and/or silicon oxynitride. Compared with silicon oxide, silicon nitride and silicon oxynitride have higher hardness, so that the isolation wall has higher structure stability.

In the embodiment, using a nitrogen gas or an ammonia gas as a nitrogen source, the ion doping may be performed to the silicon oxide with nitrogen plasma. The radio frequency power for forming the nitrogen plasma is 600 W to 2000 W, and for example be 800 W, 1200 W, or 1600 W. The temperature of the nitrogen plasma is 600° C. to 800° C., for example be 650° C., 700° C., or 750° C.

Since the thermal shock resistance of the silicon oxide is weaker than that of the silicon nitride, the ion doping is performed under a lower plasma temperature, which is beneficial to avoid stress concentration, fracture, surface peeling and other damages to the second isolation layer 25 due to a larger thermal shock, ensuring that the isolation wall has a higher structure stability.

Figure 11:
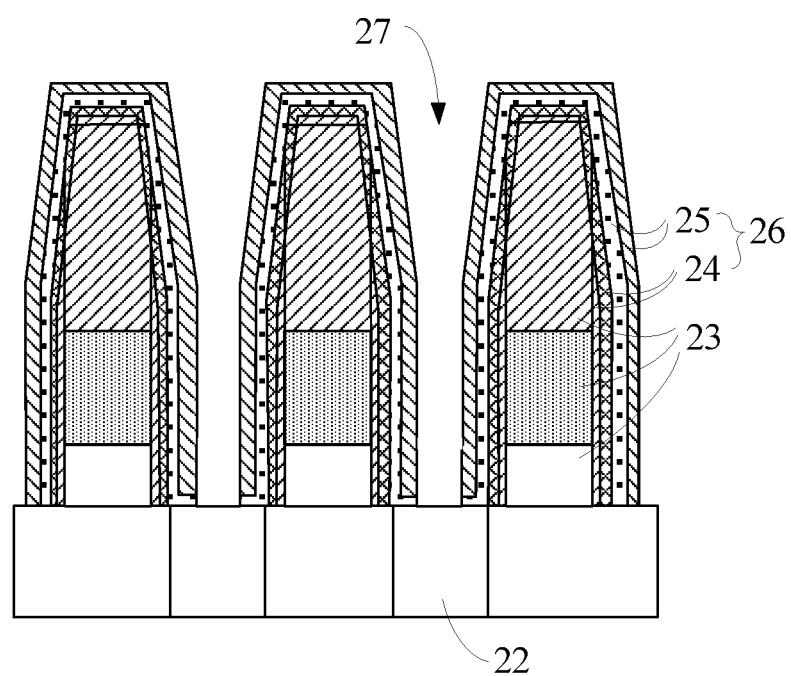
FIG. 11 is an eighth schematic diagram of sectional structures corresponding to various operations of a method for manufacturing a semiconductor structure provided by an embodiment of the present disclosure.
Figure 12:
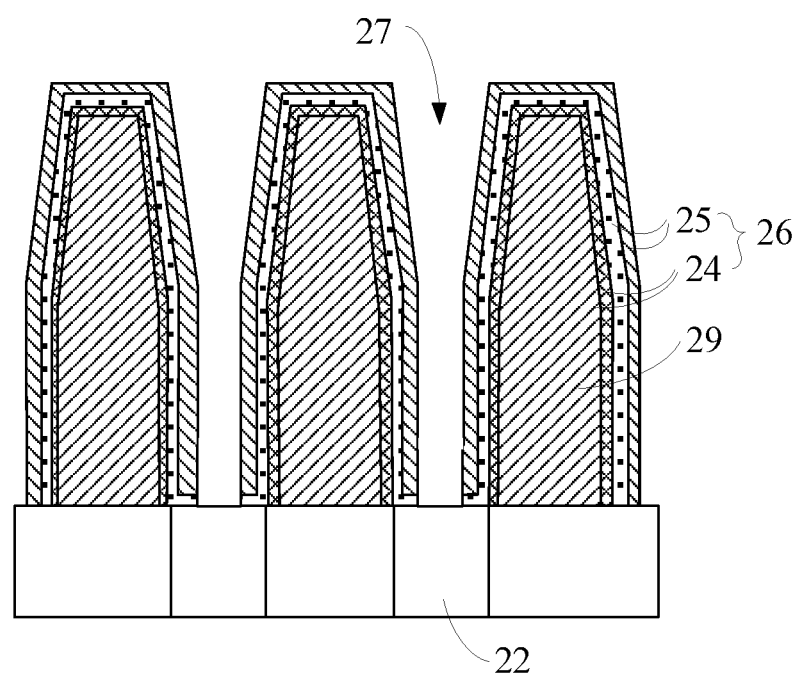
FIG. 12 is a ninth schematic diagram of sectional structures corresponding to various operations of a method for manufacturing a semiconductor structure provided by an embodiment of the present disclosure.

Referring to FIG. 11, an etching process is performed to expose the conductive contact regions 22.

In the embodiment, after removing the bottom dielectric layer, the remaining first isolation layer 24 and second isolation layer 25 constitute the isolation wall 26. The region surrounded by the isolation walls 26 between adjacent bit line structures 23 constitutes the capacitor contact hole 27, and the capacitor contact hole 27 exposes the conductive contact region 22.

In the embodiment, in a direction parallel to the orientation of the bit line structure 23, the isolation wall 26 include multiple dielectric materials stacked sequentially, which constitute nitride-oxide-nitride structures (NON structure). The dielectric material (nitride) of the isolation wall 26 in contact with structures adjacent thereto (for example, the bit line structure 23, the conductive plug, and the spacer layer 29) has a higher hardness, and has the sidewall supporting effect. The damage to the structure of the isolation wall 26 caused by the external stress is avoided. The dielectric material (oxide) of the isolation wall 26 deviating from the adjacent structures has a lower dielectric constant, so that the isolation wall 26 has a lower dielectric constant, thereby reducing the parasitic capacitance between the bit line structure 23 and the conductive plug.

In the embodiment, the ion doping process is adopted, so that one single isolation layer has the good sidewall supporting effect and the lower dielectric constant at the same time. It is not necessary to form a new dielectric layer additionally, which is beneficial to avoid the sidewall morphology problem occurred when forming multiple dielectric layers and the thickness of the isolation layer walls 26 is reduced, thereby reserving more space for the capacitor contact hole 27, and further, and the conductive plug filled in the capacitor contact hole 27 has a lower resistance.

It should be noted that in actual process steps, a deposition process and an etching process are required each time for forming one dielectric layer, and multiple deposition processes and multiple etching processes may cause changes of the sidewall morphologies of the dielectric layers, so that a preset performance requirement may not be met. In addition, during the processes of forming dielectric layers, each dielectric layer has a corresponding minimum thickness due to the limitation of the forming process itself, and at the same time, since the distance between adjacent bit line structures 23 is fixed, the fewer the dielectric layers are, the larger the bottom area of the capacitor contact hole 27 for forming the conductive plugs is, and the smaller the resistance value of the subsequently formed conductive plug is.

In the embodiment, in a direction parallel to the orientation of the bit line structures 23, the top width of the capacitor contact hole 27 is greater than its bottom width. In addition, referring to FIG. 12, in a direction parallel to the orientation of the spacer layer 29, the top width of the spacer layer 29 is smaller than its bottom width, the isolation wall 26 is located on the sidewalls of the spacer layer 29, and the top width of the capacitor contact hole 27 are greater than its bottom width.

In the embodiment, the dry etching process is performed by adopting the mixed plasma of three gases $SF_6$, $CF_4$ and $O_2$, and the residual gas is cleaned by using an inert gas (for example argon).

Figure 13:
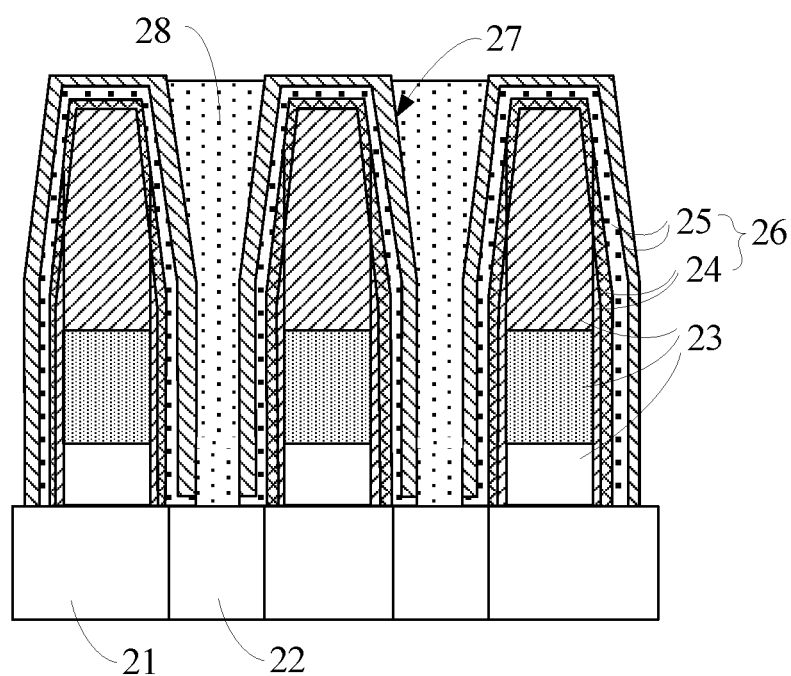
FIG. 13 is a tenth schematic diagram of sectional structures corresponding to various operations of a method for manufacturing a semiconductor structure provided by an embodiment of the present disclosure.

Referring to FIG. 13, the capacitor contact hole 27 is filled with a conductive material to form a conductive plug 28 in contact with the conductive contact region 22.

In the embodiment, the conductive material includes polysilicon. Before performing a polysilicon deposition possess, a seed layer with a good step coverage may be formed firstly by adopting an atomic layer deposition process. The silicon source of the polysilicon may be $H_3SiN(C_3H_7)_2$, $Si_2H_6$ or $SiH[N(CH_3)_2]_3$, the reaction temperature to form the polysilicon may be 380° C.-500° C., and the gas pressure may be 1 torr to 3 torr.

In the embodiment, the capacitor contact hole 27 have a larger process window, so that the top opening of the capacitor contact hole 27 may be prevented from being sealed in advance during filling the conductive material, ensuring the conductive material fills up the capacitor contact hole, and the conductive plug 28 with smaller resistance value is formed.

In the embodiment, the ion doping possess is performed to the second isolation parts of the isolation layers, so that the first isolation parts and the second isolation parts of the isolation layers have different material properties, thereby replacing successively stacked two film layers with different material properties, and the effects of reducing the number of the isolation layers and reducing the total thickness of the isolation walls are achieved. The thinning of the isolation walls helps to increase the bottom areas of the capacitor contact holes, which further reduce the resistance values of the conductive plugs and reduce the parasitic capacitance between conductive plugs and adjacent conductive structures. In addition, by increasing the top width of the capacitor contact holes and enlarging the process window of the capacitor contact holes, the top opening of capacitor contact holes can be prevented from being sealed in advance in the material deposition process, the conductive material is ensured to fill up the capacitor contact holes, and further the conductive plugs without a void or an oxide layer and having a smaller resistance value are formed.

Accordingly, the embodiments of the invention further provide a semiconductor structure. The semiconductor structure may be manufactured by adopting the above methods for manufacturing the semiconductor structure.

Referring to FIG. 13, the semiconductor structure includes: a substrate 21, bit line structures 23 and isolation walls 26 located on sidewalls of the bit line structures 23 and capacitor contact holes 27. Conductive contact regions 22 are provided in the substrate, and the substrate 21 exposes the conductive contact regions 22. Each isolation wall 26 includes at least one isolation layer. The isolation layer includes a first isolation part close to the bit line structures 23 and a second isolation part deviating from the bit line structures 23, and the second isolation part of the at least one isolation layer has doped ions. In the isolation layer with the doped ions, the hardness of the second isolation part is greater than that of the first isolation part, or the dielectric constant of the second isolation part is smaller than that of the first isolation part. The capacitor contact holes 27 are constituted by regions surrounded by the isolation walls 26 between adjacent bit line structures 23. The capacitor contact holes 27 expose the conductive contact regions 22, and the top width is greater than the bottom width of the capacitor contact holes 27 in a direction parallel to the orientation of the bit line structures 23.

In the embodiment, an isolation wall 26 include a first isolation layer 24 and a second isolation layer 25, which are sequentially stacked. The first isolation layer 24 is located between the bit line structure 23 and the second isolation layer 25. First doped ions are included in the second isolation part of the first isolation layer 24, such that the dielectric constant of the second isolation part of the first isolation layer 24 is smaller than that of the first isolation part. Second doped ions are included in the second isolation part of the second isolation layer 25, and the hardness of the second isolation part of the second isolation layer 25 is greater than that of the first isolation part.

Specifically, the first isolation layer 24 includes a silicon nitride layer. The doped ions in the second isolation part of the first isolation layer 24 include oxygen ions, and the material of the second isolation part includes silicon oxynitride. The second isolation layer 25 includes a silicon oxide layer, the doped ions in the second isolation part of the second isolation layer 25 include nitrogen ions, and the material of the second isolation part includes silicon nitride and/or silicon oxynitride.

In the embodiment, the tops of the bit line structures 23 have chamfers. The angle of the chamfers is 5°-35°, for example 10°, 15°, 20° or 30°.

In the embodiment, there are doped ions in the second isolation part of the at least one isolation layer. The presences of the doped ions change the property of the material of the isolation layer, such that the first isolation part and the second isolation part of the isolation layer have different properties. In other words, two sequentially stacked film layers which have different properties may be replaced by one isolation layer with the second isolation part contains the doped ions. Therefore, the number of isolation layers is reduced, and the total thickness of the isolation walls is reduced, thereby increasing the bottom area of the capacitor contact holes, further reducing the resistance of the conductive plugs and further reducing the parasitic capacitance between the conductive plugs and the adjacent conductive structures. In addition, the top width of the capacitor contact holes are greater than the bottom width of the capacitor contact holes, which is beneficial to ensure that when the capacitor contact holes are used to be filled with a conductive material to form the conductive plugs, the conductive material is ensured to fill up the capacitor contact holes, avoiding the void problem, therefore the conductive plugs are ensured to have a smaller resistance value.

Those of ordinary skilled in the art can understand that aforementioned embodiments are specific embodiments for implementing the present disclosure, and in practical applications, various changes in the forms and details may be made thereto without departing from the spirit and scopes of the present disclosure. Any person skilled in the art can make their own changes and modifications without departing from the spirit and scopes of the present disclosure, and therefore the protection scope of the present disclosure, should be defined by the scopes of the claims.

What is claimed is:

1. A method for manufacturing a semiconductor structure, comprising:
    providing a substrate, conductive contact regions being provided in the substrate, and the substrate exposing the conductive contact regions;
    forming multiple discrete bit line structures on the substrate, wherein the bit line structures are configured to expose the conductive contact regions, and a top width is smaller than a bottom width of the bit line structures in a direction parallel to an orientation of the bit line structures; and
    forming isolation walls including at least one isolation layer on sidewalls of the bit line structures, wherein capacitor contact holes are constituted by regions defined by the isolation walls between adjacent bit line structures, the isolation layer comprises first isolation part close to the bit line structures and a second isolation part deviating from the bit line structures, wherein in a step of forming the isolation walls, doping doped ions into the second isolation part of the at least one isolation layer, such that a hardness of the second isolation part is greater than that of the first isolation part, or a dielectric constant of the second isolation part is smaller than that of the first isolation part;
    wherein forming the isolation walls comprises:
        forming a first isolation layer on the sidewalls of the bit line structures, the first isolation layer comprising a first isolation part of the first isolation layer close to the bit line structures and a second isolation part of the first isolation layer deviating from the bit line structures;
        doping the second isolation part of the first isolation layer with first doped ions, such that the dielectric constant of the second isolation part of the first isolation layer is smaller than that of the first isolation part of the first isolation layer;
        forming a second isolation layer on a side of the first isolation layer deviating from the second isolation part, the second isolation layer comprising a first isolation part of the second isolation layer close to the bit line structures and a second isolation part of the second isolation layer deviating from the bit line structures; and
        doping the second isolation part of the second isolation layer with second doped ions, such that the hardness of the second isolation part of the second isolation layer is greater than that of the first isolation part of the second isolation layer.

2. The method for manufacturing a semiconductor structure of claim 1, wherein forming the multiple discrete bit line structures comprises: forming multiple discrete initial bit line structures, a top width being greater than or equal to a bottom width of the initial bit line structures in a direction parallel to the orientation of the initial bit line structures; and performing a dry etching process with an etching angle to the initial bit line structures to form the bit line structures with chamfers at their tops, in which the chamfers have a same angle as the etching angle, and the angle of the chamfers is 5°-35°.

3. The method for manufacturing a semiconductor structure of claim 2, further comprising: after forming the isolation walls, filling the capacitor contact holes with a conductive material to form conductive plugs in contact with the conductive contact regions.

4. The method for manufacturing a semiconductor structure of claim 1, wherein the first isolation layer comprises a silicon nitride layer; and doping the second isolation part of the first isolation layer with first doped ions comprising: doping the second isolation part of the first isolation layer with oxygen ions; and/or, the second isolation layer comprises a silicon oxide layer; and doping the second isolation part of the second isolation layer with second doped ions comprising: doping the second isolation part of the second isolation layer with nitrogen ions.

5. The method for manufacturing a semiconductor structure of claim 4, further comprising: after forming the isolation walls, filling the capacitor contact holes with a conductive material to form conductive plugs in contact with the conductive contact regions.

6. The method for manufacturing a semiconductor structure of claim 1, wherein forming the isolation walls comprises: forming a silicon nitride layer as the first isolation layer on the sidewalls of the bit line structures; doping the second isolation part of the silicon nitride layer with oxygen ions; and forming a silicon oxide layer as the second isolation layer on a side of the silicon nitride layer deviating from the bit line structures, and doping the second isolation part of the silicon oxide layer with nitrogen ions.

7. The method for manufacturing a semiconductor structure of claim 6, wherein in the doping the oxygen ions, a temperature of the oxygen ions is 800° C.-1000° C.; and in the doping the nitrogen ions, a temperature of the nitrogen ions is 600° C.-800° C.

8. The method for manufacturing a semiconductor structure of claim 1, further comprising: after forming the isolation walls, filling the capacitor contact holes with a conductive material to form conductive plugs in contact with the conductive contact regions.

9. A method for manufacturing a semiconductor structure, comprising:
providing a substrate, conductive contact regions being provided in the substrate, and the substrate exposing the conductive contact regions;
forming multiple discrete bit line structures on the substrate, wherein the bit line structures are configured to expose the conductive contact regions, and a top width is smaller than a bottom width of the bit line structures in a direction parallel to an orientation of the bit line structures; and
forming isolation walls including at least one isolation layer on sidewalls of the bit line structures, wherein capacitor contact holes are constituted by regions defined by the isolation walls between adjacent bit line structures, the isolation layer comprises a first isolation part close to the bit line structures and a second isolation part deviating from the bit line structures;
wherein forming the isolation walls comprises: forming a silicon nitride layer on the sidewalls of the bit line structures; doping a second isolation part of the silicon nitride layer with oxygen ions; and forming a silicon oxide layer on a side of the silicon nitride layer deviating from the bit line structures, and doping a second isolation part of the silicon oxide layer with nitrogen ions.

10. The method for manufacturing a semiconductor structure of claim 9, wherein forming the multiple discrete bit line structures comprises: forming multiple discrete initial bit line structures, a top width being greater than or equal to a bottom width of the initial bit line structures in a direction parallel to the orientation of the initial bit line structures; and performing a dry etching process with an etching angle to the initial bit line structures to form the bit line structures with chamfers at their tops, in which the chamfers have a same angle as the etching angle, and the angle of the chamfers is 5°-35°.

11. The method for manufacturing a semiconductor structure of claim 9, wherein in the doping the oxygen ions a temperature of the oxygen ions is 800° C.-1000° C.; and in the doping the nitrogen ions a temperature of the nitrogen ions is 600° C.-800° C.

12. The method for manufacturing a semiconductor structure of claim 9, further comprising: after forming the isolation walls, filling the capacitor contact holes with a conductive material to form conductive plugs in contact with the conductive contact regions.

* * * * *